United States Patent
Fujitsuka et al.

(10) Patent No.: US 8,558,208 B2
(45) Date of Patent: Oct. 15, 2013

(54) RESISTANCE RANDOM ACCESS MEMORY INCLUDING VARIABLE-RESISTANCE LAYERS

(75) Inventors: Ryota Fujitsuka, Mie (JP); Masahiro Kiyotoshi, Mie (JP); Katsuyuki Sekine, Mie (JP); Mitsuru Sato, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 285 days.

(21) Appl. No.: 13/097,375

(22) Filed: Apr. 29, 2011

(65) Prior Publication Data

US 2012/0068144 A1    Mar. 22, 2012

(30) Foreign Application Priority Data

Sep. 22, 2010   (JP) ................. 2010-212200

(51) Int. Cl.
  *H01L 29/02*   (2006.01)
(52) U.S. Cl.
  USPC ..... 257/2; 257/3; 257/4; 257/5; 257/E29.002; 438/102; 438/103; 438/104

(58) Field of Classification Search
  USPC ............. 257/1–5, E29.002; 438/102–104; 365/163, 148
  See application file for complete search history.

(56) References Cited

U.S. PATENT DOCUMENTS

2004/0114413 A1 *  6/2004  Parkinson et al. ............ 365/100
2010/0054014 A1    3/2010  Lee et al.

FOREIGN PATENT DOCUMENTS

| JP | 2009-33160 | 2/2009 |
|----|------------|--------|
| JP | 2009-283486 | 12/2009 |
| JP | 2010-27753 | 2/2010 |
| JP | 2010-114422 | 5/2010 |

\* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, there are provided a first electrode, a second electrode, first and second variable-resistance layers that are arranged between the first electrode and the second electrode, and at least one non variable-resistance layer that is arranged so that positions of the first and second variable-resistance layers between the first electrode and the second electrode are symmetrical to each other.

10 Claims, 7 Drawing Sheets

RESISTANCE RANDOM ACCESS MEMORY INCLUDING VARIABLE-RESISTANCE LAYERS

CROSS-REFERENCE TO RELATED APPLICATIONS

This application is based upon and claims the benefit of priority from the prior Japanese Patent Application No. 2010-212200, filed on Sep. 22, 2010; the entire contents of which are incorporated herein by reference.

FIELD

Embodiments described herein relate generally to a resistance random access memory.

BACKGROUND

For a resistance random access memory (ReRAM), there is provided, in order to achieve muitilevelling, a method for modulating an amplitude (voltage) and a time of a pulse stress to be applied to an electrode and generating a plurality of high resistance states when changing a memory cell from a low resistance state (set state) to a high resistance state (reset state). In order to stably realize muitilevelling of the resistance random access memory, it is desired to enhance controllability for transiting among resistance states.

DETAILED DESCRIPTION

In general, according to one embodiment a resistance random access memory is provided with a first electrode, a second electrode, first and second variable-resistance layers, and at least one non variable-resistance layer. The first and second variable-resistance layers are arranged between the first electrode and the second electrode. The non variable-resistance layer is arranged so that positions of the first and second variable-resistance layers between the first electrode and the second electrode are symmetrical to each other.

Exemplary embodiments of the resistance random access memory will be explained below in detail with reference to the accompanying drawings. The present invention is not limited to the following embodiments.

First Embodiment

Figure 1:
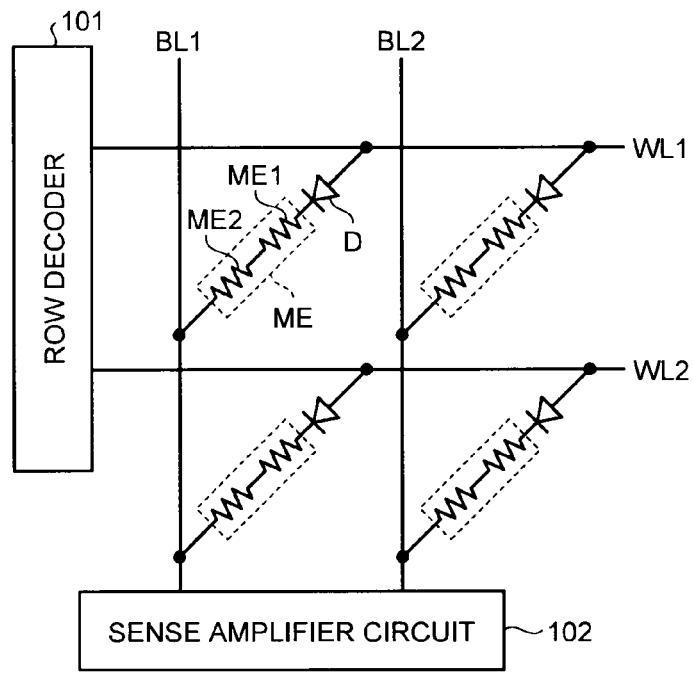
FIG. 1 is a block diagram illustrating a schematic structure of four cells of a resistance random access memory according to a first embodiment.

FIG. 1 is a block diagram illustrating a schematic structure of four cells of a resistance random access memory according to a first embodiment.

In FIG. 1, bit lines BL1 and BL2 are provided in the column direction and word lines WL1 and WL2 are provided in the row direction. The memory cells ME and the rectifier devices D are provided on the intersections between the bit lines BL1, BL2 and the word lines WL1, WL2, respectively. The rectifier devices D may employ a pin diode, for example.

The memory cells ME and the rectifier devices D are connected in series, the other end of each memory cell ME is connected to the bit line BL1, BL2, and the other end of each rectifier device D is connected to the word line WL1, WL2.

The word lines WL1 and WL2 are connected to a row decoder 101 for selecting the word line WL1, WL2. The bit lines BL1 and BL2 are connected to a sense amplifier circuit 102 for detecting data read from the memory cells ME and controlling a voltage of each bit line BL1, BL2 when the data is written into the memory cells ME.

Each memory cell ME is provided with the resistance layers ME1 and ME2 and the resistance layers ME1 and ME2 are connected in series. Each resistance layer ME1, ME2 can transit between a low resistance state and a high resistance state depending on an applied voltage and one memory cell ME can store four values.

Figure 2:
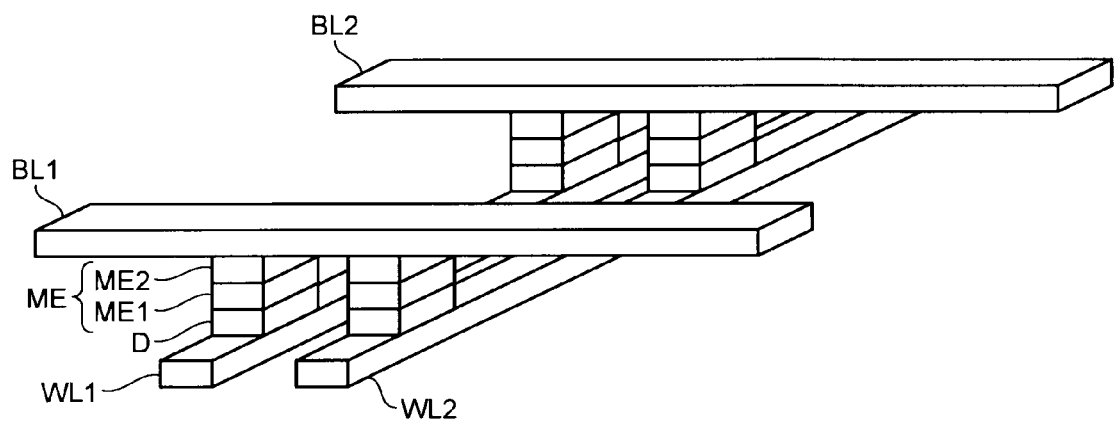
FIG. 2 is a perspective view illustrating a schematic structure of four cells of the resistance random access memory according to the first embodiment.

FIG. 2 is a perspective view illustrating a schematic structure of four cells of the resistance random access memory according to the first embodiment.

In FIG. 2, the rectifier devices D are stacked on the word line WL1, WL2 at the intersection between each bit line BL1, BL2 and each word line WL1, WL2, the memory cells ME are stacked on the rectifier devices D, and the bit line BL1, BL2 is stacked on the memory cells ME. For the memory cells ME, the resistance layer ME2 is stacked on the resistance layer ME1.

Although the four cells of two rows by two columns are described in the examples illustrated in FIGS. 1 and 2, it may be applied to n×m cells of n (n is a positive integer) rows×m (m is a positive integer) columns. Although one layer of cell formed to be sandwiched between the bit line BL1, BL2 and the word line WL1, WL2 is illustrated, an arbitrary number of such structures may be repeatedly stacked to be three dimensional.

Figure 3:
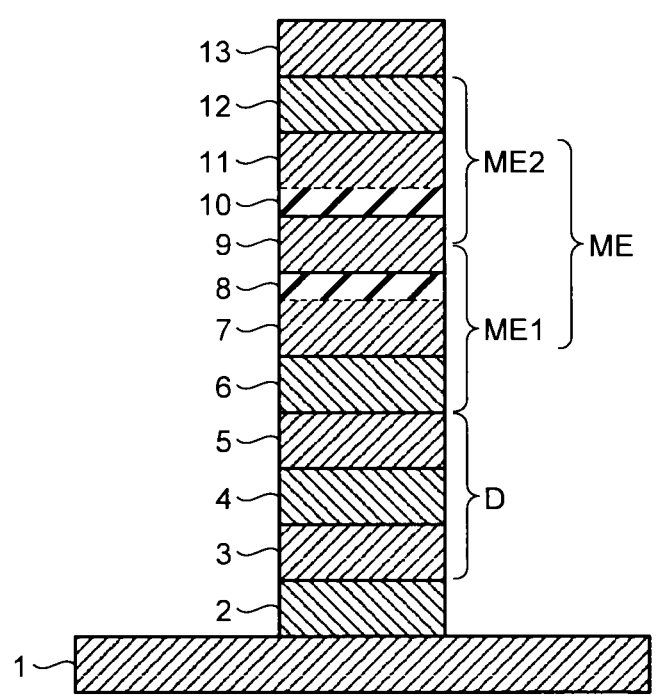
FIG. 3 is a cross-sectional view illustrating a schematic structure of one cell of the resistance random access memory according to the first embodiment.

FIG. 3 is a cross-sectional view illustrating a schematic structure of one cell of the resistance random access memory according to the first embodiment.

In FIG. 3, an electrode 2, a p-type semiconductor layer 3, an i-type semiconductor layer 4, an n-type semiconductor layer 5, an electrode 6, a variable-resistance layer 7, a non variable-resistance layer 8, an electrode 9, a non variable-resistance layer 10, a variable-resistance layer 11 and an electrode 12 are sequentially stacked on the intersection between the word line 1 and the bit line 13.

The electrodes 2, 6, 9 and 12 may employ a TiN film, for example. The material for the p-type semiconductor layer 3, the i-type semiconductor layer 4 and the n-type semiconductor layer 5 may employ Si, Ge, SiGe, SiC, SiSn, PbS, GaAs, InP, GaP, GaInAsP, GaN or ZnSe, for example. The variable-resistance layers 7 and 11 may employ a transition metal oxide layer such as $HfO_2$, $ZrO_2$, NiO, $V_2O_5$, ZnO, $TiO_2$, $Nb_2O_5$, $WO_3$ or CoO, or a layer containing transition metal oxide. The composition of the transition metal oxide may not have a stoichiometric proportion, and may be oxygen-less composition such as HfOx (X<2). The material of the non variable-resistance layers 8 and 10 may employ a layer containing an insulator such as $SiO_2$, $Al_2O_3$ or SiN, for example.

The thickness of the variable-resistance layer 7, 11 may be set at about 5 nm, for example, and the thickness of the non variable-resistance layer 8, 10 may be set at about 3 nm, for example.

The rectifier device D is configured of the p-type semiconductor layer 3, the i-type semiconductor layer 4 and the n-type semiconductor layer 5. There is described the method for employing a pin diode for the rectifier device D, but other structures employing a pn diode or the like may be used.

The resistance layer ME1 is configured of the electrode 6, the variable-resistance layer 7, the non variable-resistance layer 8 and the electrode 9. The resistance layer ME2 is configured of the electrode 9, the non variable-resistance layer 10, the variable-resistance layer 11 and the electrode 12.

The variable-resistance layer 7 contacts the electrode 6. The variable-resistance layer 11 contacts the electrode 12. The non variable-resistance layers 8 and 10 are arranged between the electrodes 6 and 12. The non variable-resistance layer 8 contacts the variable-resistance layer 7. The non variable-resistance layer 10 contacts the variable-resistance layer 11. The electrode 9 is arranged between the non variable-resistance layers 8 and 10.

In other words, the order in which the variable-resistance layer 7 and the non variable-resistance layer 8 are stacked in the resistance layer ME1 and the order in which the variable-resistance layer 11 and the non variable-resistance layer 10 are stacked in the resistance layer ME2 are symmetrical to the electrode 9.

Figure 4A:
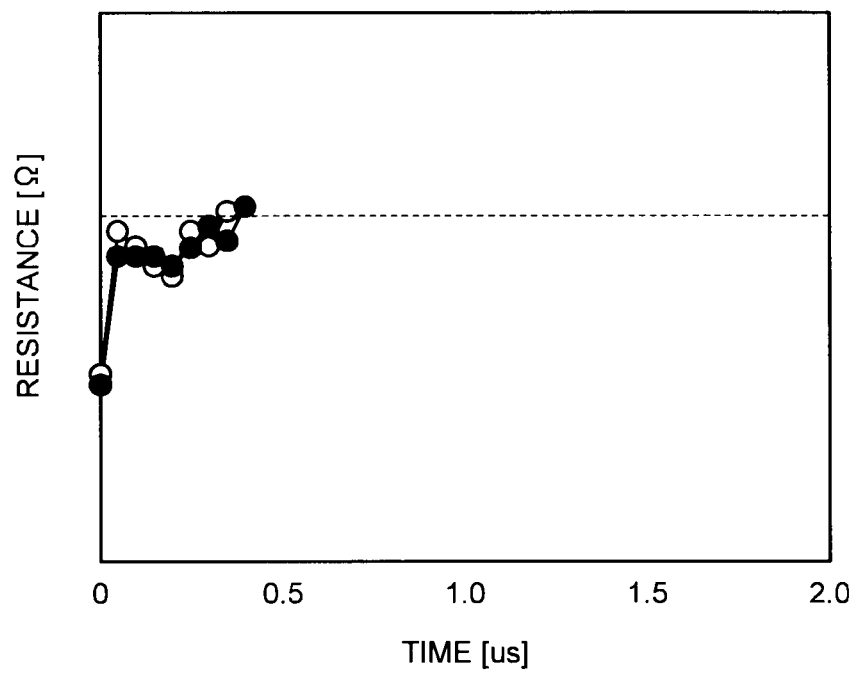
FIG. 4A is a diagram illustrating a relationship between an applied time when a negative bias is applied to an electrode 9 of FIG. 3 and a resistance of a resistance layer ME1.
Figure 4B:
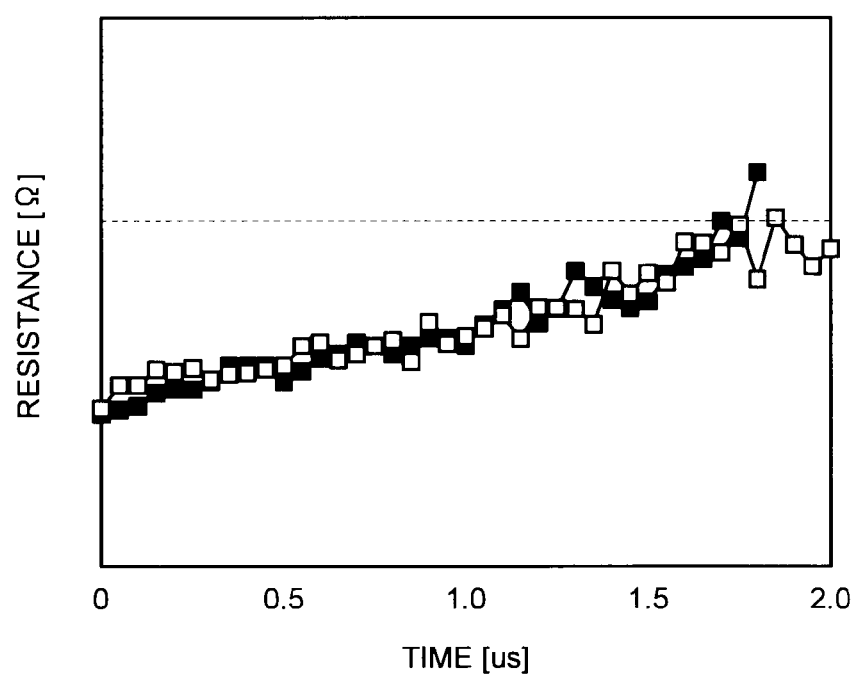
FIG. 4B is a diagram illustrating a relationship between an applied time when a positive bias is applied to the electrode 9 of FIG. 3 and a resistance of the resistance layer ME1.

FIG. 4A is a diagram illustrating a relationship between an applied time when a negative bias is applied to the electrode 9 of FIG. 3 and a resistance of the resistance layer ME1, and FIG. 4B is a diagram illustrating a relationship between an applied time when a positive bias is applied to the electrode 9 of FIG. 3 and a resistance of the resistance layer ME1.

In FIG. 4A, an operation of forming the resistance layer ME1 is performed in order to turn the resistance layer ME1 to be resistance-variable (in order to form a conductive filament indicating a resistance changing operation). In the forming operation, a positive bias is applied to the electrode 9 on top of the resistance layer ME1 to turn the resistance layer ME1 to be a low resistance state.

Thereafter, a negative bias of −2.5 V is applied to the electrode 9 to examine a behavior of the resistance change relative to a stress-applied time (the number of applied pulses). In this case, the resistance layer ME1 is turned to be highly resistant in a short time of 50 nsec. Therefore, a negative short pulse less than about several hundreds nsec width is applied to the electrode 9 thereby to enable the operation of resetting the resistance layer ME1.

On the other hand, in FIG. 4B, a positive bias is applied to the electrode 9 on top of the resistance layer ME1 to turn the resistance layer ME1 to be a low resistance state in order to perform the operation of forming the resistance layer ME1.

Thereafter, a positive bias of +2.5 V is applied to the electrode 9 to examine a behavior of a resistance change relative to a stress-applied time (the number of applied pulses). In this case, several μ sec are required for turning the resistance layer ME1 to be highly resistant. Thus, even when a positive short pulse less than about several hundreds nsec width is applied to the electrode 9, the operation of resetting the resistance layer ME1 is not possible.

In contrast to when a negative bias is applied to the electrode 9, when a positive bias is applied to the electrode 9, it takes much time to turn the resistance layer ME1 to be highly resistant since the non variable-resistance layer 8 is arranged at the anode end contributing to the resistance changing operation.

Similarly, for the resistance layer ME2, when a positive bias is applied to the electrode 12 on top of the resistance layer ME2, the resistance layer ME2 is turned to be highly resistant in a short time of 50 nsec as illustrated in FIG. 4A. On the other hand, when a negative bias is applied to the electrode 12 on top of the resistance layer ME2, several μ sec are required for turning the resistance layer ME2 to be highly resistant as illustrated in FIG. 4B.

In contrast to when a positive bias is applied to the electrode 12, when a negative bias is applied to the electrode 12, it takes much time to turn the resistance layer ME2 to be highly resistant since the non variable-resistance layer 10 is arranged at the anode end contributing to the resistance changing operation.

Thus, in the structure in which the resistance layer ME2 is stacked on the resistance layer ME1, when a negative bias is applied to the electrode 12 while both the resistance layers ME1 and ME2 are in a low resistance state, the resistance layer ME1 is turned to be highly resistant prior to the resistance layer ME2. When the resistance layer ME1 enters a high resistance state, most of the voltage is applied to the resistance layer ME1 and few voltage is applied to the resistance layer ME2. Thus, even when a negative bias is applied to the electrode 12 thereafter, the resistance layer ME2 does not enter a high resistance state and the resistance layer ME1 remains at a high resistance and the resistance layer ME2 remains at a low resistance.

In the structure in which the resistance layer ME2 is stacked on the resistance layer ME1, when a positive bias is applied to the electrode 12 while both the resistance layers ME1 and ME2 are in a low resistance state, the resistance layer ME2 enters a high resistance state prior to the resistance layer ME1. When the resistance layer ME2 enters a high resistance state, most of the voltage is applied to the resistance layer ME2 and few voltage is applied to the resistance layer ME1. Thus, even when a positive bias is applied to the electrode 12 thereafter, the resistance layer ME1 does not enter a high resistance state, and the resistance layer ME1 remains at a low resistance and the resistance layer ME2 remains at a high resistance.

Figure 5:
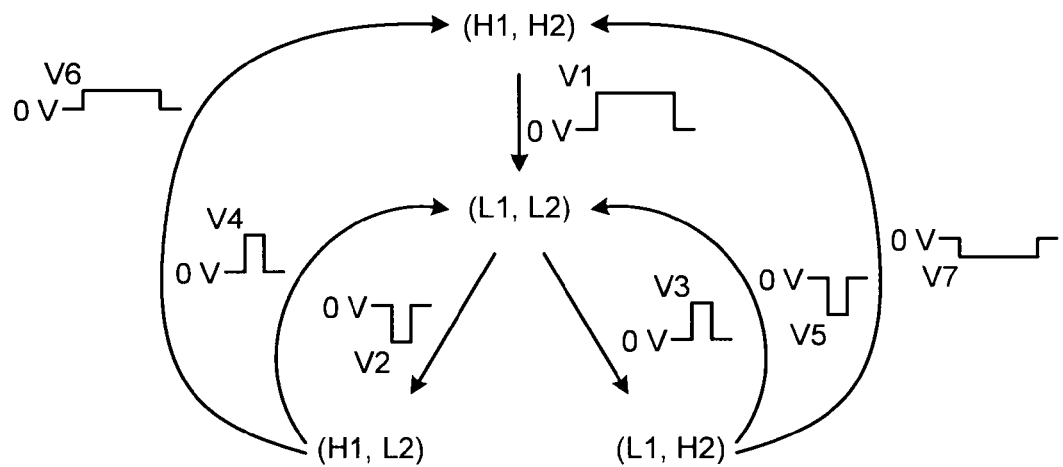
FIG. 5 is a diagram illustrating transition states among resistance states of the memory cell ME of FIG. 3.

FIG. 5 is a diagram illustrating transition states among resistance states of the memory cell ME of FIG. 3. In FIG. 5, the state of the resistance layer ME1 at a high resistance and the resistance layer ME2 at a high resistance is denoted as (H1, H2), the state of the resistance layer ME1 at a low resistance and the resistance layer ME2 at a low resistance is denoted as (L1, L2), the state of the resistance layer ME1 at a high resistance and the resistance layer ME2 at a low resistance is denoted as (H1, L2), and the state of the resistance layer ME1 at a low resistance and the resistance layer ME2 at a high resistance is denoted as (L1, H2).

In FIG. 5, a positive bias of voltage V1 is applied to the electrode 12 from the (H1, H2) state so that both the resistance layers ME1 and ME2 are formed to be in the (L1, L2) state.

Next, when a negative bias of voltage V2 less than several hundreds nsec width is applied to the electrode 12 from the (L1, L2) state, only the resistance layer ME1 enters a high resistance state to transit to the (H1, L2) state.

On the other hand, when a positive bias of voltage V3 less than several hundreds nsec width is applied to the electrode 12 from the (L1, L2) state, only the resistance layer ME2 enters a high resistance state to transit to the (L1, H2) state.

When a positive bias of voltage V4 is applied to the electrode 12 from the (H1, L2) state, most of the voltage is applied to the resistance layer ME1 in a high resistance state and the resistant layer ME1 changes to a low resistance state thereby to transit to the (L1, L2) state.

On the other hand, when a negative bias of voltage V5 is applied to the electrode 12 from the (L1, H2) state, most of the voltage is applied to the resistance layer ME2 in a high resistance state and the resistance layer ME2 changes to a low resistance state thereby to transit to the (L1, L2) state.

When a positive bias of voltage V6 smaller in absolute value than the voltage V4 is applied to the electrode 12 from the (H1, L2) state for a long time, the resistance layer ME2 in a low resistance state changes to a high resistance state due to Joule heat caused by a current to transit to the (H1, H2) state. The absolute value of the voltage V6 may be set at a small value such that the high resistance state of the resistance layer ME1 does not change.

When a negative bias of voltage V7 smaller in absolute value than the voltage V5 is applied to the electrode 12 from the (L1, H2) state for a long time, the resistance layer ME1 in a low resistance state changes to a high resistance state due to Joule heat caused by a current to transit to the (H1, H2) state. The absolute value of the voltage V7 may be set at a small value such that the high resistance state of the resistance layer ME2 does not change.

For example, the absolute values of the voltages V2 to V5 may be set at 2.5V and the absolute values of the voltages V6 and V7 may be set at 0.5V.

Thus, it is possible to achieve the four values while enhancing the controllability for transiting among the four states of (H1, H2), (L1, L2), (H1, L2) and (L1, H2).

In order to achieve the four values, the resistance value of the memory cell ME in the (H1, L2) state and the resistance value of the memory cell ME in the (L1, H2) state need to be different from each other. When the same material is used for the variable-resistance layers 7 and 11, the values of the voltages V2 and V3 are different from each other, for example, so that the resistance value of the memory cell ME in the (H1, L2) state and the resistance value of the memory cell ME in the (L1, H2) state can be different from each other. Alternatively, the applied time of the negative bias of the voltage V2 and the applied time of the positive bias of the voltage V3 may be different from each other.

If it is assumed that the resistance value of (H1, H2) is R1, the resistance value of (H1, L2) is R2, the resistance value of (L1, H2) is R3, the resistance value of (L1, L2) is R4 and R2>R3 can be obtained, R1>R2>R3>R4 is obtained.

Therefore, a small voltage not influencing each resistance state of the memory cell ME is applied and a current flowing through the memory cell ME is detected by the sense amplifier circuit 102 of FIG. 1 to decide which states the resistance values R1 to R4 of the memory cell ME are at.

There is described the bipolar operating method in order to achieve the four values in the example of FIG. 5, but the unipolar operation can be performed in order to achieve the three values by transiting among the three states of (H1, H2), (L1, L2) and (L1, H2).

Figure 6:
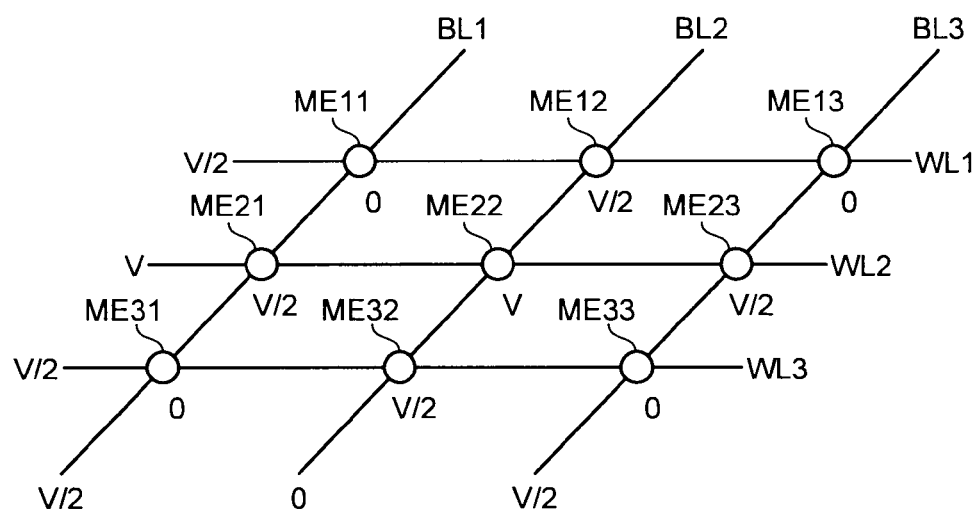
FIG. 6 is a diagram illustrating a voltage applying method when a memory cell is selected during a bipolar operation of the resistance random access memory of FIG. 1.

FIG. 6 is a diagram illustrating a voltage applying method when a memory cell is selected during the bipolar operation of the resistance random access memory of FIG. 1.

In FIG. 6, the bit lines BL1 to BL3 are provided in the column direction and the word lines WL1 to WL3 are provided in the row direction. The memory cells ME11 to ME13, ME21 to ME23, and ME31 to ME33 are provided on the intersections between the bit lines BL1 to BL3 and the word lines WL1 to WL3, respectively. A structure in which the memory cell ME is connected to the rectifier device D in series as shown in FIG. 1 may be employed for each of the memory cells ME11 to ME13, ME21 to ME23, and ME31 to ME33.

For example, when the memory cell ME22 is selected, a voltage of V is applied to the word line WL2 and a voltage of V/2 is applied to the word lines WL1 and WL3. On the other hand, a voltage of 0 is applied to the bit line BL2 and a voltage of V/2 is applied to the bit lines BL1 and BL3.

Consequently, the voltage of V is applied to the memory cell ME22 to operate as a selective bit. The voltage of V/2 is applied to the memory cells ME12, ME21, ME23 and ME32 to operate as a semiselective bit. The voltage of 0 is applied to the memory cells ME11, ME13, ME31 and ME33 to operate as a nonselective bit. At this time, the rectifier device D is controlled such that a current flows through the memory cells ME as selective bits and a current does not flow through the memory cells ME as semiselective bits and nonselective bits.

Figure 7:
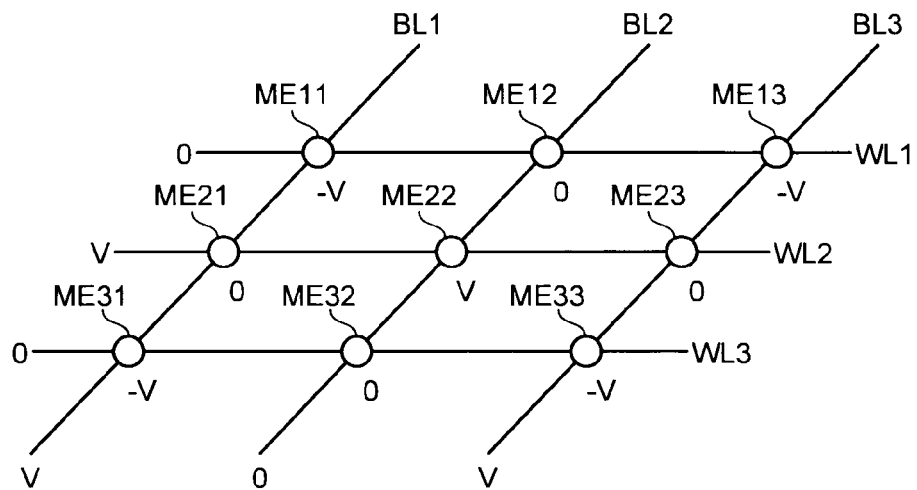
FIG. 7 is a diagram illustrating a voltage applying method when a memory cell is selected during a unipolar operation of the resistance random access memory of FIG. 1.

FIG. 7 is a diagram illustrating a voltage applying method when a memory cell is selected during the unipolar operation of the resistance random access memory of FIG. 1.

In FIG. 7, when the memory cell ME22 is selected, for example, a voltage of V is applied to the word line WL2 and a voltage of 0 is applied to the word lines WL1 and WL3. On the other hand, a voltage of 0 is applied to the bit line BL2 and a voltage of V is applied to the bit lines BL1 and BL3.

Consequently, the voltage of V is applied to the memory cell ME22 to operate as a selective bit. The voltage of 0 is applied to the memory cells ME12, ME21, ME23 and ME32 to operate as a semiselective bit. A voltage of −V is applied to the memory cells ME11, ME13, ME31 and ME33 to operate as a nonselective bit.

In order that a current flows through the memory cells ME as selective bits and a current does not flow through the memory cells ME as semiselective bits and nonselective bits, the rectifier device D can have the characteristics in which a current does not flow in the reverse direction until −V and a current rapidly flows in the forward direction.

In the configuration of FIG. 3, explanation is given for the method of arranging the variable-resistance layer 7 to be in contact with the electrode 6 and arranging the variable-resistance layer 11 to be in contact with the electrode 12. However, it is applicable to interchange the positions of the variable-resistance layer 7 and the non variable-resistance layer 8 and interchange the positions of the variable-resistance layer 11 and the non variable-resistance layer 10 to arrange the non variable-resistance layer 8 in contact with the electrode 6 and arrange the non variable-resistance layer 10 in contact with the electrode 12.

Second Embodiment

Figure 8:
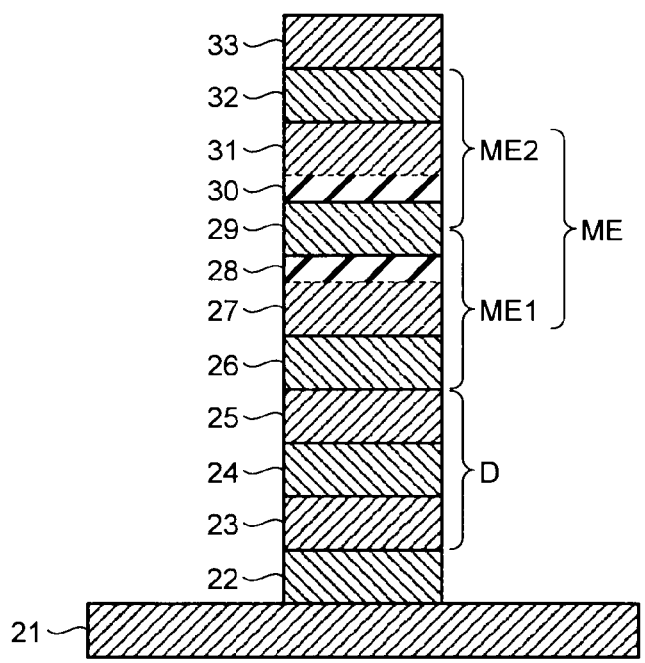
FIG. 8 is a cross-sectional view illustrating a schematic structure of one cell of a resistance random access memory according to a second embodiment.

FIG. 8 is a cross-sectional view illustrating a schematic structure of one cell of a resistance random access memory according to a second embodiment.

In FIG. 8, an electrode 22, a p-type semiconductor layer 23, an i-type semiconductor layer 24, an n-type semiconductor layer 25, an electrode 26, a variable-resistance layer 27, a non variable-resistance layer 28, an electrode 29, a non variable-resistance layer 30, a variable-resistance layer 31 and an electrode 32 are sequentially stacked on the intersection between the word line 21 and the bit line 33.

The rectifier device D is configured of the p-type semiconductor layer 23, the i-type semiconductor layer 24 and the n-type semiconductor layer 25. The resistance layer ME1 is configured of the electrode 26, the variable-resistance layer 27, the non variable-resistance layer 28 and the electrode 29. The resistance layer ME2 is configured of the electrode 29, the non variable-resistance layer 30, the variable-resistance layer 31 and the electrode 32.

The variable-resistance layer 27 contacts the electrode 26. The variable-resistance layer 31 contacts the electrode 32. The non variable-resistance layers 28 and 30 are arranged between the electrodes 26 and 32. The non variable-resistance layer 28 contacts the variable-resistance layer 27. The non variable-resistance layer 30 contacts the variable-resistance layer 31. The electrode 29 is arranged between the non variable-resistance layers 28 and 30.

In other words, the order in which the variable-resistance layer 27 and the non variable-resistance layer 28 are stacked in the resistance layer ME1 and the order in which the variable-resistance layer 31 and the non variable-resistance layer 30 are stacked in the resistance layer ME2 are symmetrical to the electrode 29.

Different materials may be employed for the variable-resistance layers 27 and 31, and, for example, $HfO_2$ may be employed for the material of the variable-resistance layer 27 and $TiO_2$ may be employed for the material of the variable-resistance layer 31.

The mutually different materials are employed for the variable-resistance layers 27 and 31 so that the resistance values of the variable-resistance layers 27 and 31 in the reset state may be different from each other due to the insulative characteristics of the transition metal oxide.

Specifically, since $TiO_2$ is smaller in band gap and less insulative than $HfO_2$, the (H1, L2) state is larger in resistance value than the (L1, H2) state. Consequently, R2>R3 can be obtained irrespective of the magnitude of the bias applied to the memory cell ME and the applied time, and a resistance margin can be increased in the states, thereby enhancing the device reliability during the multivalue operation such as data holding property.

When the material is different between the variable-resistance layers 27 and 31, the resistance value is different between the (H1, L2) state and the (L1, H2) state, but when materials, which are significantly different in the band gap or energy barrier height of electrons relative to the electrodes 26, 32, are selected, a resistance margin can be enlarged between the (H1, L2) state and the (L1, H2) state.

In the configuration of FIG. 8, explanation is given for the method of arranging the variable-resistance layer 27 to be in contact with the electrode 26 and arranging the variable-resistance layer 31 to be in contact with the electrode 32. However, it is applicable to interchange the positions of the variable-resistance layer 27 and the non variable-resistance layer 28 and interchange the positions of the variable-resistance layer 31 and the non variable-resistance layer 30 to arrange the non variable-resistance layer 28 in contact with the electrode 26 and arrange the non variable-resistance layer 30 in contact with the electrode 32.

Third Embodiment

Figure 9:
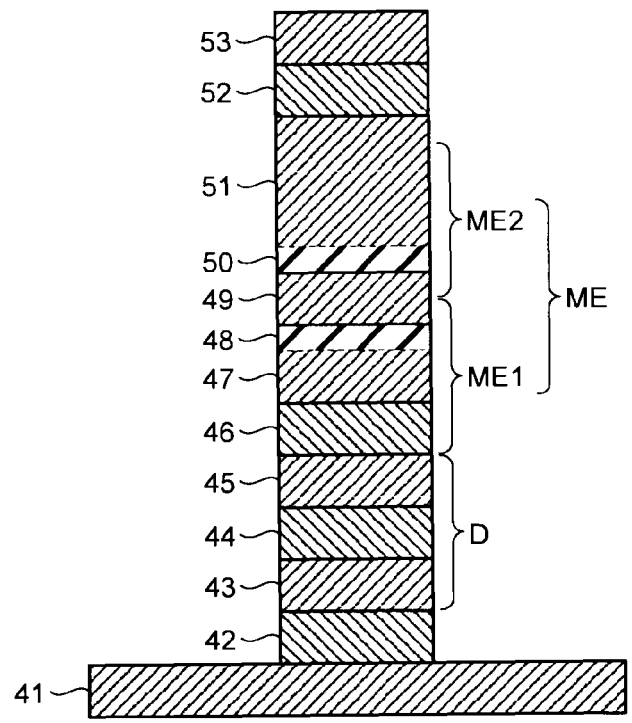
FIG. 9 is a cross-sectional view illustrating a schematic structure of one cell of a resistance random access memory according to a third embodiment.

FIG. 9 is a cross-sectional view illustrating a schematic structure of one cell of a resistance random access memory according to a third embodiment.

In FIG. 9, an electrode 42, a p-type semiconductor layer 43, an i-type semiconductor layer 44, an n-type semiconductor layer 45, an electrode 46, a variable-resistance layer 47, a non variable-resistance layer 48, an electrode 49, a non variable-resistance layer 50, a variable-resistance layer 51 and an electrode 52 are sequentially stacked on the intersection between the word line 41 and the bit line 53.

The rectifier device D is configured of the p-type semiconductor layer 43, the i-type semiconductor layer 44 and the n-type semiconductor layer 45. The resistance layer ME1 is configured of the electrode 46, the variable-resistance layer 47, the non variable-resistance layer 48 and the electrode 49. The resistance layer ME2 is configured of the electrode 49, the non variable-resistance layer 50, the variable-resistance layer 51 and the electrode 52.

The variable-resistance layer 47 contacts the electrode 46. The variable-resistance layer 51 contacts the electrode 52. The non variable-resistance layers 48 and 50 are arranged between the electrodes 46 and 52. The non variable-resistance layer 48 contacts the variable-resistance layer 47. The non variable-resistance layer 50 contacts the variable-resistance layer 51. The electrode 49 is arranged between the non variable-resistance layers 48 and 50.

In other words, the order in which the variable-resistance layer 47 and the non variable-resistance layer 48 are stacked in the resistance layer ME1 and the order in which the variable-resistance layer 51 and the non variable-resistance layer 50 are stacked in the resistance layer ME2 are symmetrical to the electrode 49.

The thickness may be different between the variable-resistance layers 47 and 51, and, for example, the variable-resistance layer 51 may be larger in thickness than the variable-resistance layer 47.

The thickness is different between the variable-resistance layers 47 and 51 so that the resistance value may be different between the variable-resistance layers 47 and 51 in the reset state.

For example, when the variable-resistance layer 51 is larger in thickness than the variable-resistance layer 47, the variable-resistance layer 51 is larger in resistance value than the variable-resistance layer 47 and the (H1, L2) state is smaller in resistance value than the (L1, H2) state. Consequently, R3>R2 can be obtained irrespective of the magnitude of the bias applied to the memory cell ME and the applied time, and a resistance margin can be increased in the states, thereby enhancing the device reliability during the muitilevel operation such as data holding property.

In the configuration of FIG. 9, explanation is given for the method of arranging the variable-resistance layer 47 to be in contact with the electrode 46 and arranging the variable-resistance layer 51 to be in contact with the electrode 52. However, it is applicable to interchange the positions of the variable-resistance layer 47 and the non variable-resistance layer 48 and interchange the positions of the variable-resistance layer 51 and the non variable-resistance layer 50 to arrange the non variable-resistance layer 48 in contact with the electrode 46 and arrange the non variable-resistance layer 50 in contact with the electrode 52.

Fourth Embodiment

There is described in the above embodiments the method for constituting the resistance layers ME1 and ME2 in the stack structure containing transition metal oxide and an insulating film such as silicon oxide, but the resistance layers ME1 and ME2 may be constituted in a stack structure containing other different materials.

For example, there may be employed a "metal ion movement type" in which a silicon oxide film or metal oxide film (which is a solvent for ion movement), or a film containing carbon as a main component and a metal layer (which is an ion diffusion source) are stacked to change a resistance due to the metal ion diffusion into the solvent.

Alternatively, there may be employed an "oxygen ion movement type" in which a tunnel insulative film which changes in the amount of tunnel current depending on the oxidization state and a material as oxygen ion storage layer are stacked and oxygen ions are exchanged at the interface between both the layers to modulate a resistance value of the tunnel insulative film and to cause the resistance changing operation.

Figure 10:
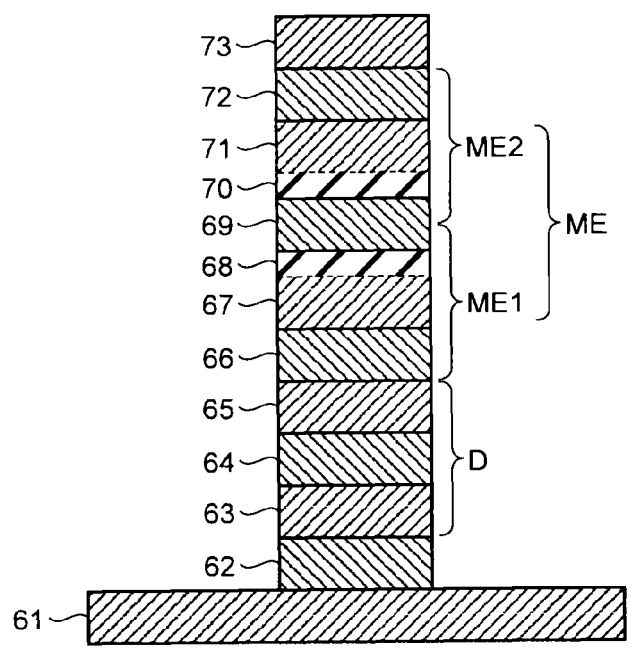
FIG. 10 is a cross-sectional view illustrating a schematic structure of one cell of a resistance random access memory according to a fourth embodiment.

FIG. 10 is a cross-sectional view illustrating a schematic structure of one cell of a resistance random access memory according to a fourth embodiment.

In FIG. 10, an electrode 62, a p-type semiconductor layer 63, an i-type semiconductor layer 64, an n-type semiconductor layer 65, an electrode 66, an oxygen storage layer 67, a tunnel film 68, an electrode 69, a tunnel film 70, an oxygen storage layer 71 and an electrode 72 are sequentially stacked on the intersection between the word line 61 and the bit line 73.

The rectifier device D is configured of the p-type semiconductor layer 63, the i-type semiconductor layer 64 and the n-type semiconductor layer 65. The resistance layer ME1 is configured of the electrode 66, the oxygen storage layer 67, the tunnel film 68 and the electrode 69. The resistance layer ME2 is configured of the electrode 69, the tunnel film 70, the oxygen storage layer 71 and the electrode 72.

The oxygen storage layer 67 contacts the electrode 66. The oxygen storage layer 71 contacts the electrode 72. The tunnel films 68 and 70 are arranged between the electrodes 66 and 72. The tunnel film 68 contacts the oxygen storage layer 67. The tunnel film 70 contacts the oxygen storage layer 71. The electrode 69 is arranged between the tunnel films 68 and 70.

In other words, the order in which the oxygen storage layer 67 and the tunnel film 68 are stacked in the resistance layer ME1 and the order in which the oxygen storage layer 71 and the tunnel film 70 are stacked in the resistance layer ME2 are symmetrical to the electrode 69.

Oxygen is stored in the oxygen storage layers 67 and 71. Oxygen is flowed into or from the tunnel films 68 and 70 depending on the magnitude or sign of the voltage to be applied to the oxygen storage layers 67 and 71 so that the resistance values of the resistance layers ME1 and ME2 can be modified.

Thus, even when the stack structures containing the oxygen storage layers 67, 71 and the tunnel films 68, 70 are used as the resistance layers ME1 and ME2, respectively, the four values can be achieved while the controllability for transiting among the four states of (H1, H2), (L1, L2), (H1, L2) and (L1, H2) is enhanced.

In order that the resistance value of the memory cell ME in the (H1, L2) state is different from the resistance value of the memory cell ME in the (L1, H2) state, the material or thickness may be mutually different between the tunnel films 68 and 70, for example.

Fifth Embodiment

Figure 11:
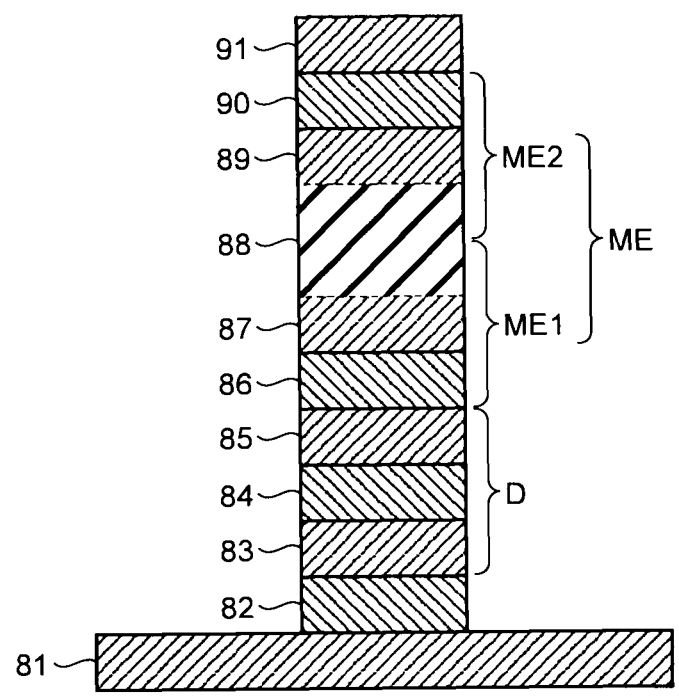
FIG. 11 is a cross-sectional view illustrating a schematic structure of one cell of a resistance random access memory according to a fifth embodiment.

FIG. 11 is a cross-sectional view illustrating a schematic structure of one cell of a resistance random access memory according to a fifth embodiment.

In FIG. 11, an electrode 82, a p-type semiconductor layer 83, an i-type semiconductor layer 84, an n-type semiconductor layer 85, an electrode 86, a variable-resistance layer 87, a non variable-resistance layer 88, a variable-resistance layer 89 and an electrode 90 are sequentially stacked on the intersection between the word line 81 and the bit line 91.

The rectifier device D is configured of the p-type semiconductor layer 83, the i-type semiconductor layer 84 and the n-type semiconductor layer 85. The resistance layer ME1 is configured of the electrode 86, the variable-resistance layer 87 and the non variable-resistance layer 88. The resistance layer ME2 is configured of the non variable-resistance layer 88, the variable-resistance layer 89 and the electrode 90.

The variable-resistance layer 87 contacts the electrode 86. The variable-resistance layer 89 contacts the electrode 90. The non variable-resistance layer 88 is arranged between the electrodes 86 and 90. The non variable-resistance layer 88 contacts the variable-resistance layers 87 and 89.

When a negative bias is applied to the electrode 90 while both the resistance layers ME1 and ME2 are in a low resistance state, the resistance layer ME1 can transit to a high resistance state prior to the resistance layer ME2, and when a positive bias is applied to the electrode 90, the resistance layer ME2 can transit to a high resistance state prior to the resistance layer ME1. Also when the electrode 9 of FIG. 3 is not present in the resistance layers ME1 and ME2, the four values can be achieved while the controllability for transiting among the four states of (H1, H2), (L1, L2), (H1, L2) and (L1, H2) is enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A resistance random access memory comprising:
a first electrode;
a second electrode;
a first variable-resistance layer and a second variable-resistance layer that are arranged between the first electrode and the second electrode; and
at least one non variable-resistance layer that is arranged so that positions of the first variable-resistance layer and the second variable-resistance layer between the first electrode and the second electrode are symmetrical to each other, wherein
the first variable-resistance layer is arranged to be in contact with the first electrode,
the second variable-resistance layer is arranged to be in contact with the second electrode, and
the at least one non variable-resistance layer is arranged between the first variable-resistance layer and the second variable-resistance layer to be in contact with the first variable-resistance layer and the second variable-resistance layer, and wherein
the at least one non variable-resistance layer includes
a first non variable-resistance layer arranged to be in contact with the first variable-resistance layer, and
a second non variable-resistance layer arranged to be in contact with the second variable-resistance layer, and a third electrode is arranged between the first non variable-resistance layer and the second non variable-resistance layer.

2. The resistance random access memory according to claim 1, wherein the first electrode, the first variable-resistance layer, the non variable-resistance layer, the second variable-resistance layer and the second electrode are stacked in this order.

3. The resistance random access memory according to claim 2, wherein a stack structure configured of the first electrode, the first variable-resistance layer, the non variable-resistance layer, the second variable-resistance layer and the second electrode is arranged at an intersection between a word line and a bit line.

4. The resistance random access memory according to claim 1, wherein the first electrode, the first variable-resistance layer, the first non variable-resistance layer, the third electrode, the second non variable-resistance layer, the second variable-resistance layer and the second electrode are stacked in this order.

5. The resistance random access memory according to claim 4, wherein a stack structure configured of the first electrode, the first variable-resistance layer, the first non variable-resistance layer, the third electrode, the second non variable-resistance layer, the second variable-resistance layer and the second electrode is arranged at an intersection between a word line and a bit line.

6. A resistance random access memory, comprising:
a first electrode;
a second electrode;
a first variable-resistance layer and a second variable-resistance layer that are arranged between the first electrode and the second electrode; and
at least one non variable-resistance layer that is arranged so that positions of the first variable-resistance layer and the second variable-resistance layer between the first electrode and the second electrode are symmetrical to each other,
wherein the at least one non variable-resistance layer includes a first non variable-resistance layer arranged between the first variable-resistance layer and the first electrode, and
a second non variable-resistance layer arranged between the second variable-resistance layer and the second electrode, and
a third electrode is arranged between the first variable-resistance layer and the second variable-resistance layer.

7. The resistance random access memory according to claim 6, wherein the first electrode, the first non variable-resistance layer, the first variable-resistance layer, the third electrode, the second variable-resistance layer, the second non variable-resistance layer, and the second electrode are stacked in this order.

8. The resistance random access memory according to claim 7, wherein a stack structure configured of the first electrode, the first non variable-resistance layer, the first variable-resistance layer, the third electrode, the second variable-resistance layer, the second non variable-resistance layer, and the second electrode is arranged at an intersection between a word line and a bit line.

9. A resistance random access memory, comprising:
a first electrode;
a second electrode;
a first variable-resistance layer and a second variable-resistance layer that are arranged between the first electrode and the second electrode; and
at least one non variable-resistance layer that is arranged so that positions of the first variable-resistance layer and the second variable-resistance layer between the first electrode and the second electrode are symmetrical to each other,
wherein the first and second variable-resistance layers are a transition metal oxide layer or a layer containing transition metal oxide, and
the at least one non variable-resistance layer is a layer containing an insulator.

10. The resistance random access memory according to claim 9, wherein the first and second variable-resistance layers are selected from among $HfO_2$, $ZrO_2$, $NiO$, $V_2O_5$, $ZnO$, $TiO_2$, $Nb_2O_5$, $WO_3$ and $CoO$.

* * * * *